United States Patent [19]

Chuang et al.

[11] Patent Number: 6,001,709
[45] Date of Patent: Dec. 14, 1999

[54] MODIFIED LOCOS ISOLATION PROCESS FOR SEMICONDUCTOR DEVICES

[75] Inventors: Da-Zen Chuang; Yi-Yu Shi, both of Taipei; Po-Sheng Chang, Nantou, all of Taiwan

[73] Assignee: Nanya Technology Corporation, Taiwan

[21] Appl. No.: 09/062,638

[22] Filed: Apr. 20, 1998

[30] Foreign Application Priority Data

Dec. 19, 1997 [TW] Taiwan ................... 86119283

[51] Int. Cl.⁶ .................. H01L 21/76; H01L 21/762
[52] U.S. Cl. .................. 438/440; 438/362; 438/407; 438/423; 257/506; 257/635; 257/638; 257/639; 257/640; 257/647
[58] Field of Search .................. 438/440, 407, 438/362, 302, 301, 199

[56] References Cited

U.S. PATENT DOCUMENTS

| | | | |
|---|---|---|---|
| 3,961,999 | 6/1976 | Antipov | 148/175 |
| 4,098,618 | 7/1978 | Crowder et al. | 148/1.5 |
| 4,748,134 | 5/1988 | Holland et al. | 438/440 |
| 4,837,172 | 6/1989 | Mizuno et al. | 438/475 |
| 5,164,806 | 11/1992 | Nagatomo et al. | 257/395 |
| 5,218,221 | 6/1993 | Okumura | 257/336 |
| 5,308,787 | 5/1994 | Hong et al. | 438/440 |
| 5,346,841 | 9/1994 | Yajima | 438/407 |
| 5,358,894 | 10/1994 | Fazan et al. | 438/440 |
| 5,393,693 | 2/1995 | Ko et al. | 438/297 |
| 5,426,063 | 6/1995 | Kaneko et al. | 438/302 |
| 5,447,885 | 9/1995 | Cho et al. | 438/440 |
| 5,488,004 | 1/1996 | Yang | 438/162 |
| 5,532,508 | 7/1996 | Kaneko et al. | 257/336 |
| 5,563,091 | 10/1996 | Lee | 438/450 |
| 5,599,731 | 2/1997 | Park | 438/440 |
| 5,712,186 | 1/1998 | Thakur et al. | 438/440 |
| 5,789,305 | 8/1998 | Peidous | 438/439 |
| 5,804,493 | 9/1998 | Juang et al. | 438/440 |
| 5,831,323 | 11/1998 | Motonami et al. | 257/506 |
| 5,834,360 | 11/1998 | Tesauro et al. | 438/445 |
| 5,856,003 | 1/1999 | Chiu | 438/362 |
| 5,869,385 | 2/1999 | Tang et al. | 438/440 |
| 5,877,048 | 3/1999 | Wu | 438/199 |
| 5,895,252 | 4/1999 | Lur et al. | 438/423 |
| 5,907,783 | 5/1999 | Kim et al. | 438/407 |

FOREIGN PATENT DOCUMENTS 317018  10/1997  Taiwan ................... H01L 21/70

*Primary Examiner*—Tom Thomas
*Assistant Examiner*—Bernard E. Souw
*Attorney, Agent, or Firm*—Michael D. Bednarek; Crowell & Moring LLP

[57] ABSTRACT

A modified LOCOS isolation process for semiconductor devices is disclosed. First, a shielding layer is formed overlying a semiconductor substrate. The shielding layer is then patterned to form an opening that exposes a portion of the semiconductor substrate for forming a device isolation region. Next, oxygen ions are implanted with a tilt angle into the semiconductor substrate to form a doped region extending to the area under the margin of the shielding layer. A thermal oxidation process is then performed to form a field oxide layer on the semiconductor substrate. Since the oxidation rate of the area under the margin of the shielding layer is increased by the implanted oxygen ions, the bird's beak effect shown in conventional LOCOS process can be eliminated. After that, the shielding layer is removed to complete the fabricating process of this invention.

10 Claims, 3 Drawing Sheets

MODIFIED LOCOS ISOLATION PROCESS FOR SEMICONDUCTOR DEVICES

BACKGROUND OF THE INVENTION

1. Field of the Invention

The present invention relates to the field of semiconductor integrated circuit (IC) manufacturing, and more particularly, to a modified LOCOS isolation process for preventing the bird's beak effect, in which oxygen ions are implanted with a tilt angle into a semiconductor substrate and a thermal oxidation process is then performed to form a field oxide layer having substantially uniform thickness.

2. Description of Related Art

With the continual improvement of semiconductor integrated circuit fabrication techniques, the number of devices that can be packed onto a semiconductor chip has increased greatly, while the geometric dimensions of the individual device have been markedly reduced. In today's fabricating process, the feature size has shrunk into the sub-micron range. In such high-density chips, each of the elements must be isolated properly in order to obtain good electrical characteristics. Device isolation technology has been developed to fulfill the above requirement, the main purpose of which is to provide good insulation between the elements using a smaller isolation area so that there is additional space for building more elements.

In the past, a so-called LOCal Oxidation of Silicon (LOCOS) technique has been widely used for device isolation of the integrated circuit chips. According to this method, a thick oxide layer is grown as an isolating region. To easily understand the technique, please refer to FIGS. 1A and 1B, which illustrate a prior-art LOCOS process. As shown in FIG. 1A, there is a semiconductor substrate 10, such as a silicon wafer. A stacked shielding layer including a pad oxide layer 11 and a silicon nitride layer 12 is formed on the semiconductor substrate 10. Appropriate photolithography and etching processes are then performed to define an opening 13 in the pad oxide layer 11 and the silicon nitride layer 12, so as to expose the area for forming a device isolating region.

Referring next to FIG. 1B, a thermal oxidation process is carried s out. For example, the silicon wafer is placed in a furnace and the temperature is raised to somewhere between 800 to 1100° C. An oxygen-containing gas is then introduced into the furnace to start the thermal oxidation for growing a thick field oxide 14 to define the margin of an active area. Since the oxidizing speed of silicon nitride is less than that of silicon, the silicon nitride layer 12 works like a mask against thermal oxidization, so the field oxide 14 grows only where the substrate 10 is not covered by the silicon nitride layer 12. After that, the silicon nitride layer 12 and the pad oxide layer 11 are removed to complete the LOCOS isolation process.

Although the conventional LOCOS technique can provide feasible isolation between elements of the integrated circuit by a relative simple process, there are a number of disadvantages becoming rather unacceptable when we attempt to apply this technique in fabricating sub-micron devices. First, the oxidization of silicon happens not only in the vertical direction but also in the horizontal direction. As a result, a part of the field oxide 14 grows beneath the adjacent silicon nitride layer 12 and lifts it up. This is termed the "bird's beak effect" by persons skilled in the art. Secondly, due to the stresses caused by the bird's beak effect, a part of nitrogen in the compressed regions of silicon nitride layer 12 diffuses to adjacent tensile strained regions at the interface of the pad oxide layer 11 and the substrate 10, and forms a silicon-nitride-like layer 15. In subsequent process steps of forming gate oxides (not shown), due to the masking effect of the silicon-nitride-like layer 15, the gate oxides will be thinner than they should be. It is termed the "white ribbon effect" because a white ribbon will appear at the edges of the active regions under examination by optical microscopes.

Additionally, because the volume of silicon dioxide is 2.2 times that of silicon, the field oxide 14 protrudes above the surface of the silicon substrate 10, forming a non-recessed surface. Also, due to the lateral expansion of the field oxide 14 during oxidation, a great deal of stress occurs in the active region. Many crystalline defects are produced near the bird's beak regions, which result in an increase of junction leakage and in a reduction of the reliability of the devices. Furthermore, the oxygen diffusion rate through the narrow opening differs from that through the wide opening. Thus, after the thermal oxidation process, the thickness of the field oxide within a narrow opening is thinner than that of the field oxide within a wide opening. This also alters the isolation property that should be.

To overcome the above-mentioned disadvantages of the conventional LOCOS process, many modified methods of forming device isolation regions are disclosed. For example, U.S. Pat. No. 4,211,582 to Horng et al uses a two-step oxidation process with plurality masks technique, and U.S. Pat. No. 4,868,136 to Ravaglia describe a combination of LOCOS and "trench" techniques. However, in each of these above processes there are some inherent drawbacks is such areas as productivity, repeatability, complexity, and maturity, as well as global planarization.

SUMMARY OF TE INVENTION

It is therefore an object of the present invention to provide a modified method of forming device isolation regions for semiconductor devices, which is able to resolve the drawbacks of the conventional LOCOS process.

It is another object of the present invention to provide a modified LOCOS process for fabricating a uniform field oxide layer to prevent the bird's beak effect and improve the characteristics of the device product.

To achieve the aforementioned objects of the present invention, a new method of forming semiconductor device isolation regions on a silicon substrate is provided. First, a shielding layer is formed overlying a semiconductor substrate. The shielding layer is then patterned to form an opening that exposes a portion of the semiconductor substrate for forming device isolation regions. Next, oxygen ions are implanted with a tilt angle into the semiconductor substrate to form a doped region extending to the area under the margin of the shielding layer. A thermal oxidation process is then performed to form a field oxide layer on the semiconductor substrate. Since the oxidation rate of the area under the margin of the shielding layer is increased by the implanted oxygen ions, the bird's beak effect shown in conventional LOCOS process can be eliminated. After that, the shielding layer is removed to complete the fabricating process of this invention.

In accordance with a preferred embodiment of the present invention, a modified LOCOS isolation process for semiconductor devices includes the following specifics. The shielding layer is a two-layer stack of a pad oxide layer and a silicon nitride layer, or a three-stack of a pad oxide layer, a polysilicon layer, and a silicon nitride layer. The tilt-angle implantation process is performed at an energy of between 50 and 150 KeV to a dosage of between $1 \times 10^{15}$ to $1 \times 10^{17}$ atoms/cm$^2$. In addition, the thermal oxidation process is performed at a temperature between 800° C. and 1100° C.

BRIEF DESCRIPTION OF THE DRAWINGS

The present invention will be more fully understood from the following detailed description of the preferred embodiment with reference to the accompanying drawings, wherein.

DETAIL DESCRIPTION OF THE PREFERRED EMBODIMENT

Figure 1A:
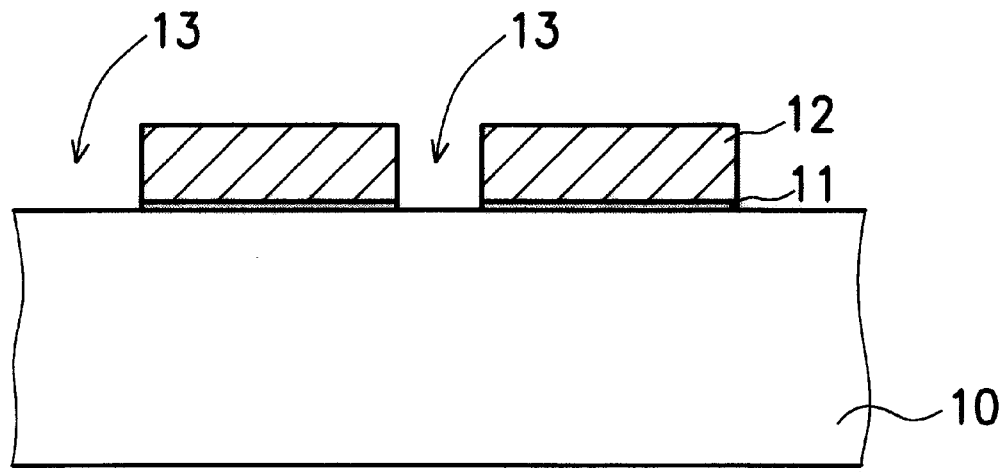
FIGS. 1A to 1B are cross-sectional views showing the process steps of the conventional LOCOS technique.
Figure 1B:
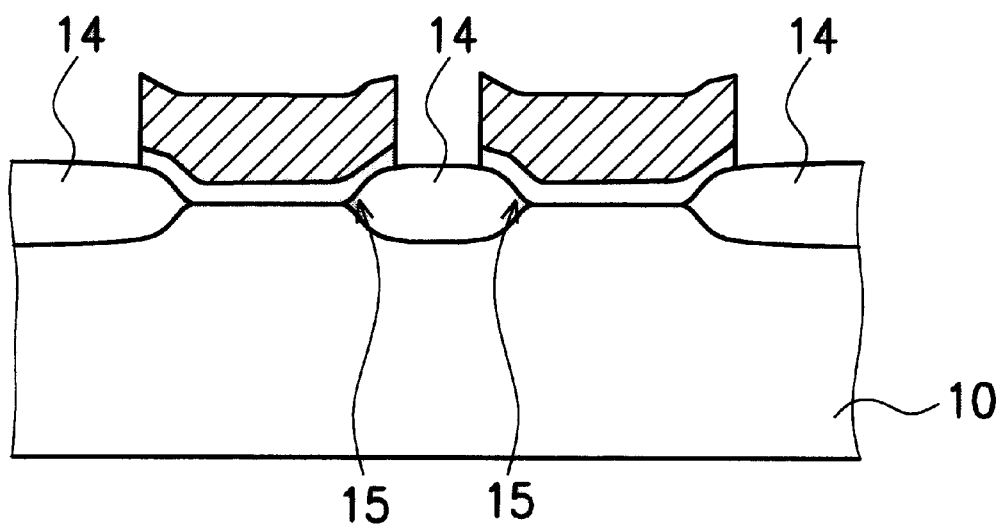
Figure 2A:
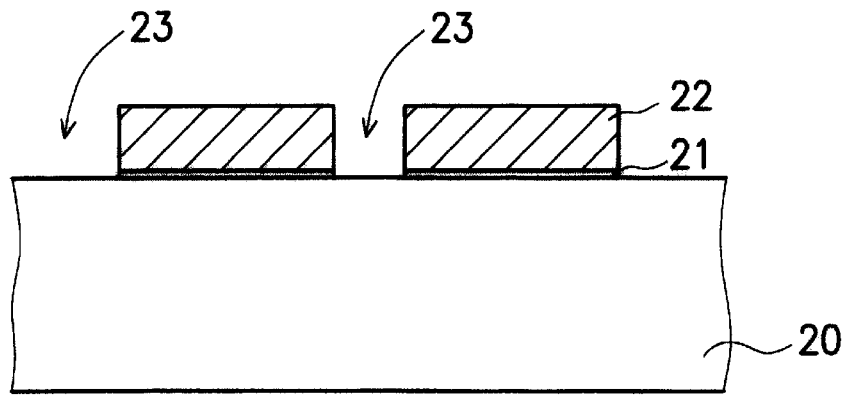
FIGS. 2A to 2D are cross-sectional views showing the process steps according to a preferred embodiment of the present invention.
Figure 2A:
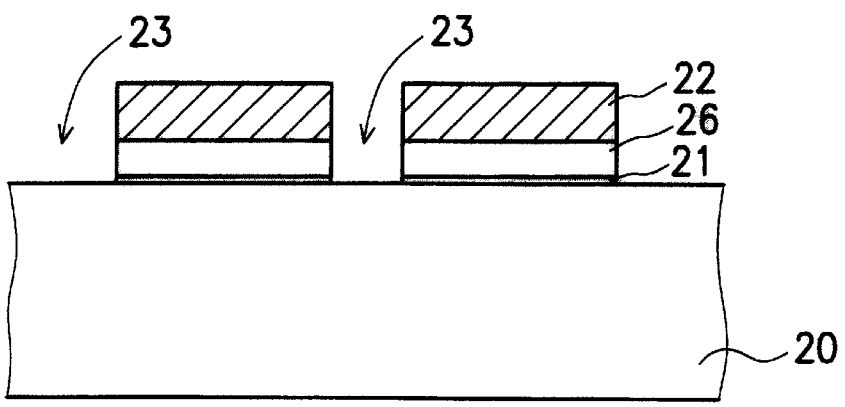

Referring to FIG. 2A, a shielding layer is formed overlying a semiconductor substrate, such as a silicon wafer 20. For example, a pad oxide (SiO$_2$) layer 21 having a thickness of between 50 and 200 Å is preferably thermally grown or deposited by CVD on the surface of the silicon wafer 20. A silicon nitride (Si$_3$N$_4$) layer 22 with a thickness of between 500 and 2000 Å is then deposited preferably by CVD on the pad oxide layer 21. The pad oxide layer 21 and the silicon nitride layer 22 form a stacked layer to constitute the shielding layer. Next, conventional photolithography and etching procedures are performed to define the pattern of the silicon nitride layer 22 and the pad oxide layer 21, so that an opening 23 exposes a portion of the silicon wafer 20 for forming a device isolation. Alternatively, as shown in FIG. 2A', in order to more effectively dissipate the upcoming thermal stress of the device isolation, the above shielding layer could further consist of a polysilicon layer 26 which is sandwiched between the pad oxide layer 21 and the silicon nitride layer 22. The polysilicon layer 26 has a thickness of, for example, between 200 and 1000 Å.

Figure 2B:
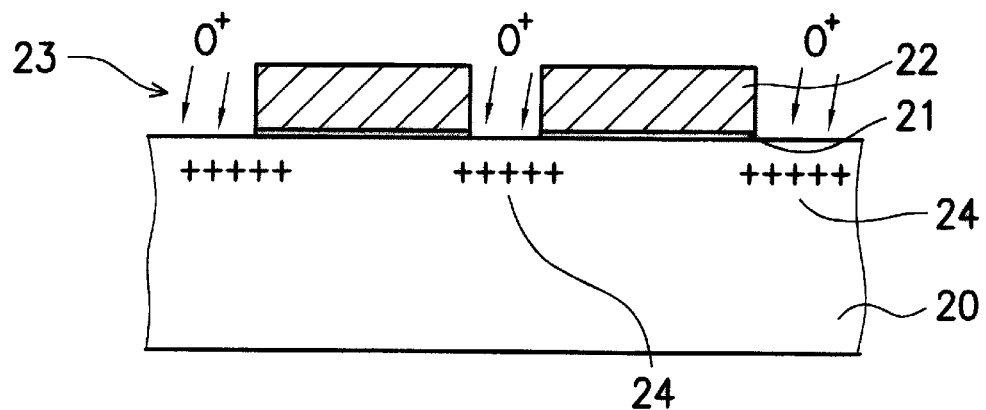

Referring to FIG. 2B, appropriate oxygen ions are implanted with a tilt angle through the opening 23 into the silicon wafer 20 to form a doped region 24. The implanting energy and dosage can be adjusted depending on the requirements of the manufacturing process. In the present preferred embodiment, for example, the implanting energy is from 50 to 150 KeV and the implanting dosage is from $1\times10^{15}$ to $1\times10^{17}$ atoms/cm$^2$. Since the oxygen ions are implanted with a tilt angle, the doped region 24 not only located within the opening 23 but also extends to the area under the margin of the shielding layer (i.e., the pad oxide layer 21 and the silicon nitride layer 22).

Figure 2C:
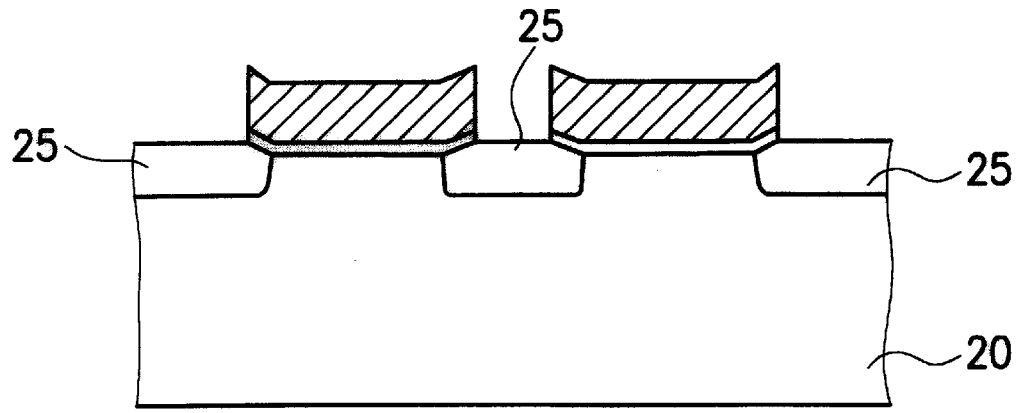

Turning now to FIG. 2C, a field oxide layer 25 is grown on the silicon wafer 20 by a thermal oxidation process. For example, the silicon wafer 20 is first placed in a furnace with a suitable high temperature of between 800 and 1100° C. An oxygen-containing gas is then introduced into the furnace to start an oxidation reaction for forming the field oxide layer 25. Since both the diffused oxygen-containing gas and the implanted oxygen ions are employed in the oxidation reaction, the whole oxidation rate is significantly increased. In addition, the implanted oxygen ions can compensate the oxidation rate under the margin of the shielding layer. This results in a field oxide layer 25 with a uniform thickness. That is, no bird's beak effect is produced by the process according to the present invention.

Figure 2D:
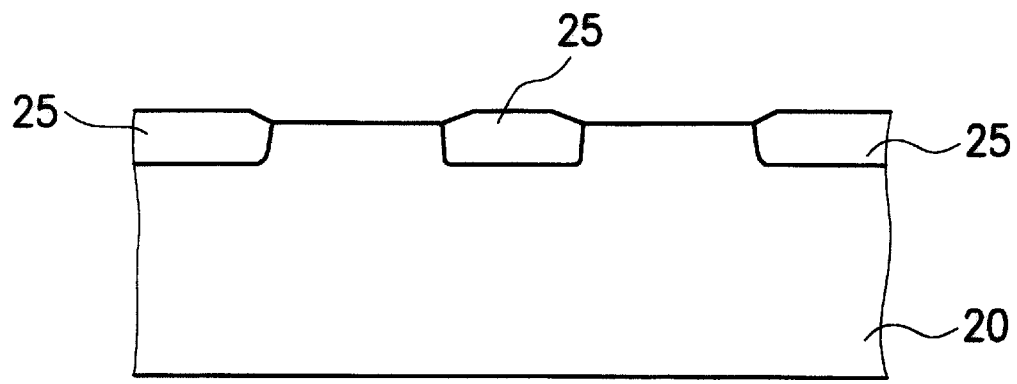

After that, the shielding layer is removed to retain the field oxide layer 25, as shown in FIG. 2D. For example, the silicon nitride layer 22 is etched by hot phosphoric acid (H$_3$PO$_4$) solution. Then, the pad oxide layer 21 is etched by dipping it in hydrofluoride (HF) acid solution.

Compared to the conventional LOCOS process, the modified process according to the present invention has the following advantages. First, appropriate oxygen ions are implanted into the semiconductor substrate to form a doped region before performing the thermal oxidation process. The implanted oxygen ions combining with the diffused oxygen-containing gas can then increase the oxidation rate of the field oxide layer. Furthermore, as the oxygen ions are implanted with a tilt angle, the doped region can extend to the area under the shielding layer. This can unify the thickness of the field oxide layer to prevent the bird's beak effect that occurs in the conventional LOCOS isolation process. Second, the implanted oxygen ions not only reduce the required oxidation time, but also increase the depth of the field oxide layer. This can then improve the flatness of the semiconductor substrate and is applicable to a multi-level semiconductor process. Additionally, the modified process according to this present invention is fully compatible with present manufacturing procedures by merely adding one tilt-angled implantation step. Thus, the modified process will not increase the manufacturing complexity or the product cost.

While the invention has been described by way of example and in terms of preferred embodiment, it is to be understood that the invention is not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A modified local oxidation of silicon (LOCOS) isolation process for semiconductor devices, comprising the steps of:

forming a shielding layer overlying a semiconductor substrate;

patterning said shielding layer to provide an opening that exposes a portion of said semiconductor substrate for forming a device isolation region;

implanting oxygen ions with a tilt angle into said semiconductor substrate to form a doped region extending to the area under the margin of the shielding layer;

performing a thermal oxidation process to form a field oxide layer on said semiconductor substrate, wherein the oxidation rate of the area under the margin of the shielding layer is increased by the implanted oxygen ions, thereby preventing the bird's beak effect; and removing said shielding layer.

2. The modified LOCOS isolation process for semiconductor devices according to claim 1, wherein said shielding layer is a stacked layer consisting of a pad oxide layer and a silicon nitride layer.

3. The modified LOCOS isolation process for semiconductor devices according to claim 2, wherein said pad oxide layer has a thickness of between 50 521 and 200 Å.

4. The modified LOCOS isolation process for semiconductor devices according to claim 2, wherein said silicon nitride layer has a thickness of between 500 Å and 2000 Å.

5. The modified LOCOS isolation process for semiconductor devices according to claim 1, wherein said shielding layer is a stacked layer consisting of a pad oxide layer, a polysilicon layer, and a silicon nitride layer.

6. The modified LOCOS isolation process for semiconductor devices according to claim 5, wherein said pad oxide layer has a thickness of between 50 Å and 200 Å.

7. The modified LOCOS isolation process for semiconductor devices according to claim 5, wherein said polysilicon layer has a thickness of between 200 Å and 1000 Å.

8. The modified LOCOS isolation process for semiconductor devices according to claim 5, wherein said silicon nitride layer has a thickness of between 500 Å and 2000 Å.

9. The modified LOCOS isolation process for semiconductor devices according to claim 1, wherein said oxygen ions are implanted with implanting energy ranging from 50 to 150 KeV and an implanting dosage ranging from $1\times10^{15}$ to $1\times10^{17}$ atoms/cm$^2$.

10. The modified LOCOS isolation process for semiconductor devices according to claim 1, wherein the thermal oxidation process is performed at a temperature of between 800 ° C. and 1100 ° C.

* * * * *